United States Patent

[11] 3,564,290

[72] Inventor George Sonoda
Poughkeepsie, N.Y.
[21] Appl. No. 807,782
[22] Filed Mar. 13, 1969
[45] Patented Feb. 16, 1971
[73] Assignee International Business Machines Corporation
Armonk, N.Y.

[54] REGENERATIVE FET SOURCE FOLLOWER
11 Claims, 5 Drawing Figs.

[52] U.S. Cl. .......... 307/251, 307/205, 307/246
[51] Int. Cl. .......... H03k 17/60
[50] Field of Search .......... 307/205, 251, 279, 304, 246

[56] References Cited
UNITED STATES PATENTS

| | | | |
|---|---|---|---|
| 3,286,189 | 11/1966 | Mitchell et al. .......... | 307/251X |
| 3,457,435 | 7/1969 | Burns et al. .......... | 307/205X |
| 3,506,851 | 4/1970 | Polkinghorn et al. .......... | 307/251 |

*Primary Examiner*—John S. Heyman
*Attorneys*—Hanifin & Jancin and James E. Murray

ABSTRACT: This specification describes a logic circuit having a capacitor coupled between the gate and source of an FET to cause the potential at the gate to follow the potential at source. The charge of this capacitor is controlled to render the FET conductive or nonconductive so that pulses applied to the drain of the FET can be selectively gated or not gated through the FET to a load connected to the source of the FET. By operating the FET in this way small supply voltages may be used. These voltages can be in the order of the size of the signals transmitted to the load.

INVENTOR
GEORGE SONODA

BY James E. Murray
ATTORNEY

REGENERATIVE FET SOURCE FOLLOWER

BACKGROUND OF THE INVENTION

The present invention relates to logic circuits employing FET devices and more particularly to inverters or complementary generators.

One problem with FET logic circuits is that they require large supply voltages to operate. These large voltages are disadvantageous for a number of reasons. One reason is that the magnitude of the supply potentials used by the circuits affects the amount of power dissipated by the circuits which in turn limits the number of logic circuits that can be fitted onto a given area of a monolithic chip. Furthermore, as the supply potentials increase in magnitude so does the cost of power supplies needed to generate them. Because of these and other problems it is desirable to reduce the potentials at which FET logic circuits operate to a minimum. However, up until now the power supply potentials used to operate these circuits have generally been approximately 1.5 to 1.8 times the maximum potential of the output signals from the circuit.

In accordance with the present invention an inverter or complementary generator is provided which requires operating potentials which are approximately the same size as the output signals from the inverter. This inverter includes a FET having a capacitor coupled between its gate and source. The capacitor is charged to render the FET conductive and discharged to render it nonconductive. After the state of the FET has been selected by charging or discharging of the capacitor, the gate is allowed to float while a pulse is applied to the drain of the FET. Depending on whether the capacitor is charged or not, this pulse is or is not transmitted through the FET to a load connected to the source of the FET. When the capacitor is charged the FET conducts causing the potential at the source to increase as the current develops a potential across the load. The potential at the gate, which is floating while the pulse is applied, also increases due to the regenerative feedback through gate to source capacitor. Thus the gate to source potential remains above the operating threshold of the FET enabling the pulse to pass through it without a large initial voltage being supplied to the gate of the FET to charge the capacitor.

Therefore it is an object of this invention to provide an inverter or complementary generator.

It is another object of this invention to provide an inverter or complementary generator that provides output signals of substantially the same magnitude as the operating potentials applied to the terminals of the FET.

Other objects of the invention are to decrease the power dissipation of FET logic circuits, increase the density which these circuits can be fabricated on monolithic chips, and decrease the size of the power supplies necessary to drive FET logic circuits.

DESCRIPTION OF THE DRAWINGS

The foregoing and other objects, features and advantages of the invention will be apparent from the following more particular description of the preferred embodiments of the invention as illustrated in the accompanied drawings, of which:

In FIG. 1, devices Q1 to Q3 are enhancement mode MOSFETS or in other words metal oxide semiconductor field effect transistors whose drain to source conductance is enhanced or increased by forward biasing of their gates with respect to their sources. As illustrated, the source of device Q1 is connected to the gate of device Q1 by a capacitor C and is also connected to ground through a load represented by the capacitor $C_L$. The drain for the device Q1 is connected to a pulse source 10 which is represented herein as single-pole-double-throw switch that couples the drain of device Q1 to either ground or positive potential +V2. The analogy of the switch is used for the sake of clarity. In actuality the pulse source is not a mechanical switch as illustrated but a clocked pulse source for the application of pulses to the drain of the device Q1 at some preset interval after the application of pulses to the gate of the device Q1 is connected to a charging source +V1 through the drain to source path of device Q2 and to ground through a drain to source path of device Initially in the operation of this circuit all the devices Q1, Q2 and Q3 are not conducting and the capacitor C is discharged. Furthermore, the source and drain potentials of device Q1 are the same since the drain is connected by the switch 10 to ground and the source is connected through the discharged load capacitor $C_L$ to ground.

Figure 1:
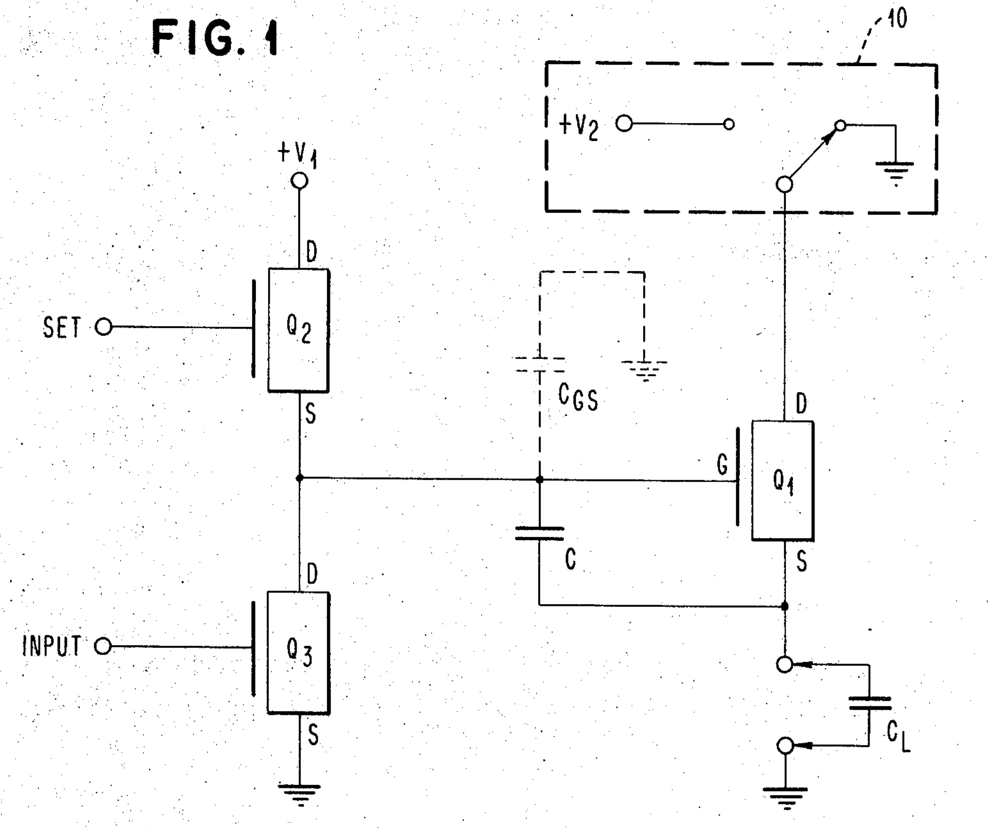
FIG. 1 shows an electrical schematic of the preferred embodiment of the invention.

The sequence of the application of pulses to the circuit will now be described. This can best be understood by simultaneous reference to FIGS. 1 and 2. As shown, a set pulse 12 is first applied to the gate of device Q2 to bias device Q2 conductive and thereby allow current to flow through device Q2 and charge the capacitor C with respect to ground. This charging of capacitor C is sufficient to bias the gate of device Q1 relative to the source of device Q1 at a potential above the threshold potential for the device Q1. With the device Q1 so biased the device Q2 is turned off by the termination of the set pulse 12 to end the charging of capacitor C. The capacitor C therefore remains charged above the threshold of device Q1 for a significant length of time since the off impedance of the device Q3 and the gate to drain and gate to source impedances of device Q1 are extremely high. Thus without further application of signals, device Q1 will pass current from its drain to its source when the switch 10 is activated to apply the potential +V2 to the drain of device Q1. However, before the switch is activated and after the application of the set pulse 12 to the gate of device Q2, a signal 14 or 16 is applied to the gate of device Q3. If this is a down input signal 14, the device Q3 remains nonconductive leaving capacitor C charged so that device Q1 remains conductive after the cessation of the input signal 14. But if an up input signal 16 is supplied to the gate terminal of device Q3, device Q3 will conduct connecting the gate of device Q1 to ground and thus discharging the capacitor C through the drain to source path of device Q3.

Let us first assume there was down input signal 14 applied to the gate terminal of device Q3. Then device Q1 remains conductive so that when the drive pulse 18 is later applied to the drain of device Q1 by activation of the switch, device Q1 will conduct current through its drain to source path. Since the drain to source path of device Q1 is essentially resistive this means that the capacitive load $C_L$ will charge raising the potential at the source of device Q1. As the potential at the source of device Q1 increases so does the potential at the gate of device Q1 since the gate is floating and connected to the source by the capacitor C. Thus the gate follows the source potential maintaining the potential difference between the gate and the source above the threshold of device Q1. Therefore the potential 20 at the source can rise to +V2 as the capacitor $C_L$ charges through device Q1. This is true even though the potential initially applied across the capacitor C or the potential initially applied to the gate of device Q1 is significantly smaller than +V2. This is possible because the gate is left floating while +V2 is applied to the drain and made to follow the source by the feedback capacitor C so as to maintain at least a threshold potential between the gate and the source.

We have now described what happens when a down input signal 14 is applied to the gate of device Q3. Let us now assume that an up input signal 16 is applied to that gate. Again, due to its being charged through device Q2, the capacitor C is initially charged. As a result, the device Q1 is biased conducting when the up input signal 16 is applied to the gate of device Q3. The up input then causes device Q3 to conduct and discharge capacitor C to ground potential thereby biasing the device Q1 off. Therefore, when the drive pulse 18 is applied to the drain by the switch after the termination of the input pulse 16, the device Q1 will not conduct since it is biased off by the zero potential connection between its gate and source. Since device Q1 does not conduct the load $C_L$ is not charged by the drive pulse 18 thereby providing a down output signal 19.

One embodiment of this invention has now been described. As can be seen the output signals across the load $C_L$ approach in magnitude the supply potentials used to drive the described circuit. Furthermore, the potential +V1 used to control device Q1 need be only sufficient to charge the capacitor C enough to render device Q1 conductive and need not approach +V2 in magnitude. The actual size of the potential +V1 will depend on the relative sizes of capacitor C and the load capacitor $C_L$ and the desired performance of the circuit. An example of some typical sizes of the capacitances involved would by a 1.5 pf. for C, 12 pf. for $C_L$. Another important capacitance is the capacitance $C_{GS}$ or the stray capacitances between the gate of device Q1 and ground. The relative magnitudes of the capacitances C and $C_{GS}$ will determine the amount of regenerative feedback from the source. A typical value for $C_{GS}$ is .2 pf. while the gate to drain capacitance of device Q1 is approximately .2 pf. also.

Figure 2:
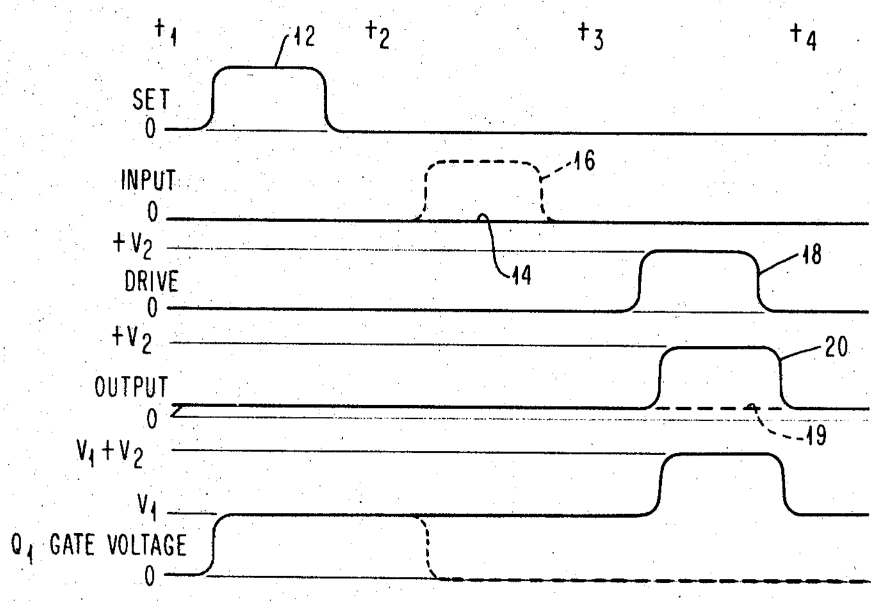
FIG. 2 shows the timing sequence of pulses applied to the various terminals of the circuit shown in FIG. 1.
Figure 3:
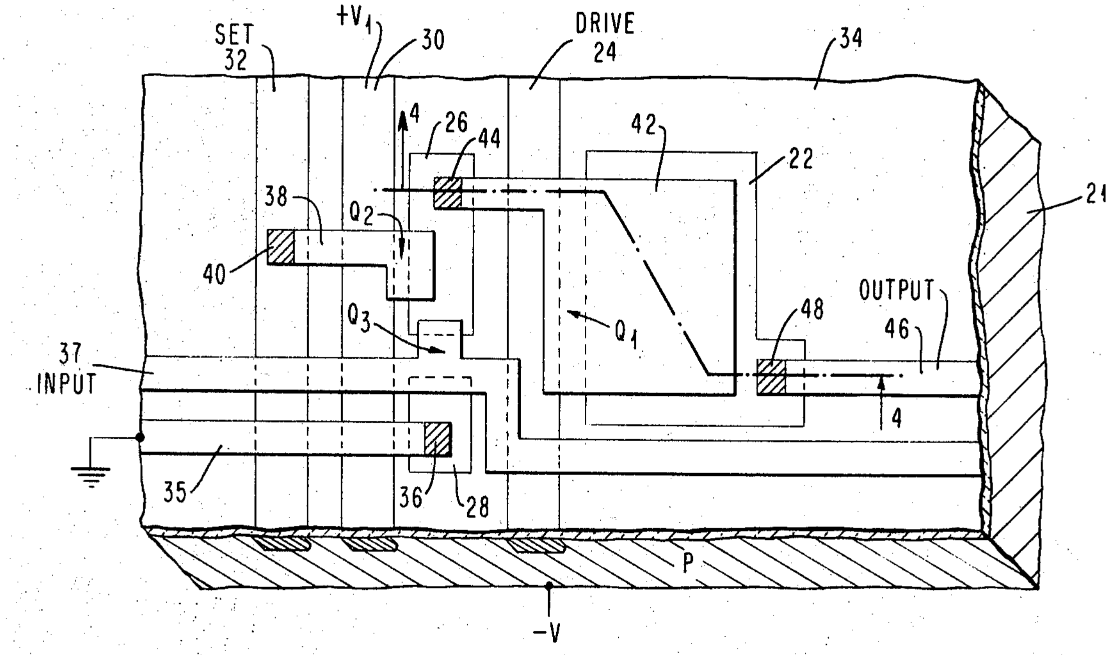
FIG. 3 is a plan view of a monolithic structure for the circuit in FIG. 1.
Figure 4:
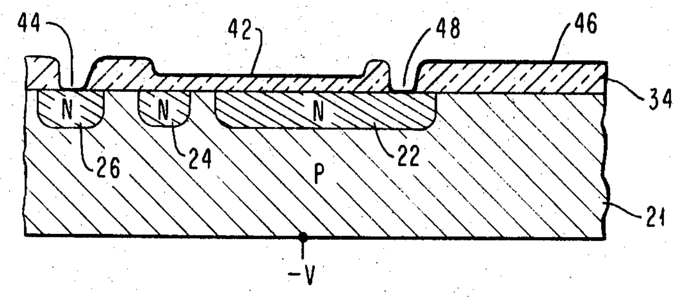
FIG. 4 is a section through the monolithic structure of FIG. 1 taken along line 4–4.

FIGS. 3 and 4 show how the circuit of FIG. 1 may be fabricated in monolithic form. Monolithic chip 21 is made of P-type silicon which contains therein a number of N-type diffusions 22 through 32. The large square diffusion 22 serves as one plate of the capacitance C and the source for device Q1 while diffusion 24 functions as the drain of device Q1. The two narrow diffusions 26 and 28 form the channel for device Q3 while diffusions 28 and 30 form the source and drain of Q2 respectively. The final diffusion 32 supplies a path for the input signals to device Q2.

On top of chip 21 and diffusions 22 through 32 is a layer 34 of silicon dioxide and on top of the silicon dioxide layer 34 are metalization areas 35, 37, 38, 42 and 46 which complete the circuit. Metalization stripe 35 passes through layer 34 at contact 36 to provide the ground connection to the source of device Q3 and metalization stripe 37 forms the path for the input signals 16 and 14 and the gate of device Q3. The metalization pattern 38 forms the gate for device Q2 and passes through the layer 34 at contact 40 to interconnect the gate of device Q2 to diffusion 32. Metalization area 42 forms the other plate of the capacitor C and the gate of device Q1. Metal area 42 also passes through the layer 34 at contact 44 to connect the gate of device Q1 to the source of device Q2 and the drain of device Q3. The final metalization strip 46 passes through the layer 34 at contact 48 to provide the output connection to the source of the device Q1.

Figure 5:
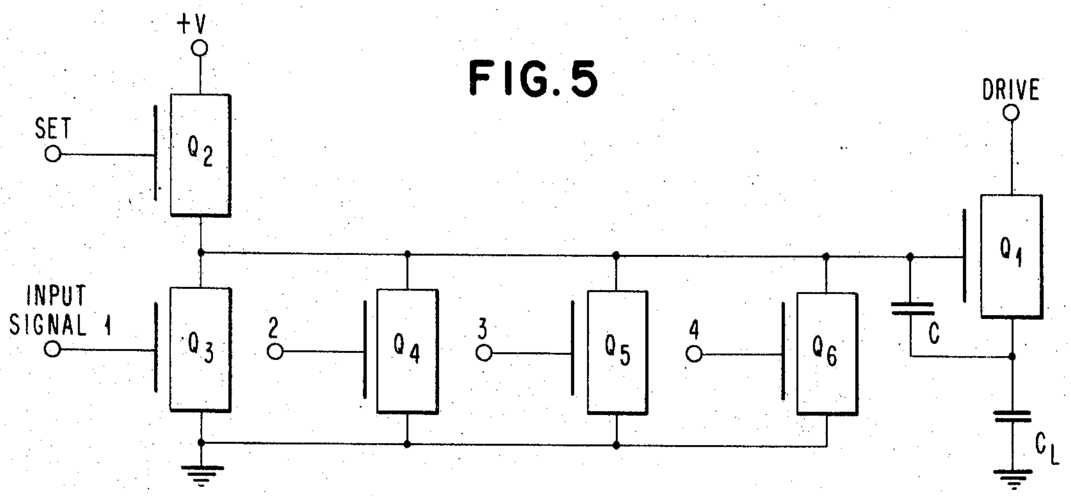
FIG. 5 is a decoder employing the circuit shown in FIG. 1.

FIG. 5 is a schematic of a decoder incorporating the present invention. The decoder is identical to the circuit shown in FIG. 1 except that there are additional devices Q4 to Q6 in shunt with device Q3. Thus when any one of these devices Q3 through Q6 is rendered conductive at the appropriate time it renders the device Q1 nonconductive. Therefore it can be seen that this circuit will perform as a parallel decoder where an up output will be present only upon the absence of up inputs at all the devices Q3 to Q6.

While the invention has been particularly shown and described with reference to the preferred embodiments thereof, it will be understood by those skilled in the art that various changes in form and detail may be made therein without departing from the spirit and scope of the invention.

I claim:

1. A gating circuit comprising:

a. an FET device having a gating terminal and two gated terminals;

b. pulsing means for the application of a drive pulse to the first of the gated terminals;

c. a load connected to the second of the gated terminals;

d. biasing means for impressing a biasing potential on the gating terminal prior to the application of the drive pulse to the first of the gated terminals; and e. capacitive feedback means coupling the gating terminal to the second of the gated terminals to bias the FET device conductive to said drive pulse by retaining charge from biasing potential and by regeneratively feeding the potential at the second of the gated terminals to the gating terminal.

2. The gating circuit of claim 1 including discharging means for selectively discharging the charge retained by the capacitor feedback means after the biasing potential has been applied to the gate but prior to the application of the drive pulse to the first of the gated terminals.

3. The gating circuit of claim 2 wherein said load is capacitive.

4. The gating circuit of claim 3 wherein said FET device is an enhancement mode metal oxide semiconductor field effect transistor.

5. A gating circuit comprising:

a. a source of drive pulses;

b. a load;

c. a first FET coupling the load to the source of drive pulses through its source to drain path;

d. a capacitor coupling the load to the gate of the first FET;

e. a source of biasing potential for charging the capacitor;

f. a second FET coupling the source of biasing potential to the gate of the first FET through the source to drain path of the second FET and the load;

g. a third FET forming a discharging path for the capacitor through the source to drain path of the third FET and the load;

h. set means for rendering the second FET conductive and then nonconductive prior to the application of a drive pulse to charge the capacitor and thereby render the first FET conductive; and i. input means for selectively rendering the third FET conductive and nonconductive after the capacitor has been charged by the set means but prior to the application of the drive pulse to render the first FET nonconductive.

6. The gating circuit of claim 5 wherein the load is a capacitor.

7. The gating circuit of claim 6 wherein the first second and third FETS are enhancement mode metal oxide semiconductor field effect transistors.

8. In a circuit for transmitting a drive pulse from a source of pulses to an output load through the drain to source path of an FET, the improvement which comprises:

a. a capacitor coupling the gate of the FET to the output load side of the drain to source path of the FET; and b. biasing means for providing a charging path to charge the capacitor prior to the transmission of the drive pulse and for supplying a high impedance path during the transmission of the drive pulse whereby the capacitor is initially charged to bias the FET conductive and then regeneratively feeds back to the gate the potential on the load side of the drain to source path to maintain the FET conductive.

9. The circuit of claim 8 including discharging means for providing a path to selectively discharge the capacitor in response to input signals occurring after the charging of the capacitor through the biasing means but prior to the drive pulse.

10. The circuit of claim 8 wherein said load is capacitive.

11. The circuit of claim 3 wherein said FET is an enhancement mode metal oxide semiconductor field effect transistor.